(12) United States Patent
Lee et al.

(10) Patent No.: US 11,693,508 B2
(45) Date of Patent: Jul. 4, 2023

(54) TOUCH DISPLAY APPARATUS

(71) Applicant: LG Display Co., Ltd., Seoul (KR)

(72) Inventors: Hwi Deuk Lee, Gumi-si (KR); Yang Sik Lee, Seoul (KR); Sang Hyuck Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/556,903

(22) Filed: Dec. 20, 2021

(65) Prior Publication Data

US 2022/0206658 A1 Jun. 30, 2022

(30) Foreign Application Priority Data

Dec. 31, 2020 (KR) ........................ 10-2020-0189504

(51) Int. Cl.
| | | |
|---|---|---|
| *G06F 3/041* | (2006.01) | |
| *G06F 3/044* | (2006.01) | |
| *H01L 27/32* | (2006.01) | |
| *H01L 51/52* | (2006.01) | |
| *H10K 50/844* | (2023.01) | |
| *H10K 59/40* | (2023.01) | |
| *H10K 59/122* | (2023.01) | |
| *H10K 59/131* | (2023.01) | |

(52) U.S. Cl.
CPC ........ *G06F 3/04166* (2019.05); *G06F 3/0446* (2019.05); *H10K 50/844* (2023.02); *H10K 59/122* (2023.02); *H10K 59/131* (2023.02); *H10K 59/40* (2023.02)

(58) Field of Classification Search
CPC .... G06F 3/041; G06F 3/04166; G06F 3/0446; H01L 27/323; H01L 27/3246; H01L 27/3276; H01L 51/5253
See application file for complete search history.

(56) References Cited

U.S. PATENT DOCUMENTS 11,315,986 B2 * 4/2022 Kim ...................... G06F 3/0443
2014/0326968 A1 11/2014 Lee

FOREIGN PATENT DOCUMENTS

| CN | 111210732 A | * | 5/2020 | .......... G06F 3/0412 |
|---|---|---|---|---|
| KR | 20-0478853 Y1 | | 11/2015 | |
| KR | 10-2016-0078619 A | | 7/2016 | |
| KR | 10-2017-0081002 A | | 7/2017 | |
| KR | 10-2019-0046725 A | | 5/2019 | |

* cited by examiner

*Primary Examiner* — Sardis F Azongha
(74) *Attorney, Agent, or Firm* — Seed IP Law Group

(57) ABSTRACT

A touch display apparatus senses a touch of a user, a tool or both. In the touch display apparatus, an upper electrode of a light-emitting device includes a first electrode portion overlapping an emission area, and a second electrode region spaced away from the first electrode region. A touch wire is disposed on an encapsulating element covering the light-emitting device. The touch wire includes a portion overlapping the second electrode region. Thus, in the touch display apparatus, a process of forming components for sensing the touch may be simplified.

20 Claims, 4 Drawing Sheets

TOUCH DISPLAY APPARATUS

This application claims the benefit of Korean Patent Application No. 10-2020-0189504 filed on Dec. 31, 2020, which is hereby incorporated by reference as if fully set forth herein.

BACKGROUND

Technical Field

The present disclosure relates to a touch display apparatus, and more particularly, to a touch display apparatus which senses a user and/or a tool.

Description of the Related Art

Generally, an electronic appliance, such as a monitor, a TV, a laptop computer and a digital camera, includes a display apparatus capable of realizing an image. For example, the display apparatus may include light-emitting devices. Each of the light-emitting devices may emit light displaying a specific color. For example, each of the light-emitting devices may include a light-emitting layer disposed between two emission electrodes.

The display apparatus may be a touch display apparatus which senses a touch of a user and/or a tool, and applies a specific signal. For example, the touch display apparatus may include a touch structure which is independently controlled with the light-emitting devices. The touch structure may be disposed on the light-emitting devices. For example, the touch structure may include touch electrodes which are disposed side by side on an encapsulating element covering the light-emitting devices. The touch electrodes may be connected in a first direction or a second direction perpendicular to the first direction. Thus, in the touch display apparatus, a process of forming the touch structure may be complicated.

BRIEF SUMMARY

Accordingly, the present disclosure is directed to a touch display apparatus that substantially obviates one or more problems due to limitations and disadvantages of the related art.

A technical feature of the present disclosure is to provide a touch display apparatus in which a process of forming a component for sensing a touch of a user and/or a tool is simplified.

Additional advantages and features of the disclosure will be set forth in part in the description which follows and in part will become apparent to those having ordinary skill in the art upon examination of the following or may be learned from practice of the disclosure. The technical features and other advantages of the disclosure may be realized and attained by the structure particularly pointed out in the written description and claims hereof as well as the appended drawings.

To achieve these technical features and other advantages and in accordance with the purpose of the disclosure, as embodied and broadly described herein, there is provided a touch display apparatus comprising a device substrate. The device substrate includes an emission area. A pixel electrode and a bank insulating layer are disposed on the device substrate. The pixel electrode is disposed on the emission area of the device substrate. The bank insulating layer covers an edge of the pixel electrode. A light-emitting layer is disposed on a portion of the pixel electrode exposed by the bank insulating layer. An upper electrode includes a first electrode region and a second electrode region. The first electrode region is disposed on the emission area. The second electrode region is spaced away from the first electrode region. A first link wire is disposed between the device substrate and the bank insulating layer. The first link wire is electrically connected to the first electrode region. The second link wire is electrically connected to the first link wire, and is spaced away from the first link wire. An encapsulating element is disposed on the upper electrode. A touch wire is disposed on the encapsulating element. The touch wire is spaced away from the emission area. The touch wire includes a portion overlapping with the second electrode region.

In accordance with various embodiments, a touch display apparatus includes a display panel, a data driver coupled to the display panel, and a touch driver coupled to the display panel. The display panel includes: a device substrate; a pixel electrode on an emission area of the device substrate; a bank insulating layer covering an edge of the pixel electrode; a light-emitting layer on an exposed portion of the pixel electrode; a separating partition on the bank insulating layer; and an upper electrode. The upper electrode includes: a first electrode region on the light-emitting layer; and a second electrode region separated from the first electrode region by the separating partition.

In accordance with various embodiments, a method includes: forming a pixel electrode of a light-emitting element over a substrate; forming a bank insulating layer on the pixel electrode, wherein a portion of the pixel electrode is exposed by the bank insulating layer; forming a light-emitting layer on the portion and on the bank insulating layer; forming a separating partition on the bank insulating layer, the separating partition surrounding the light-emitting element; and forming an upper electrode with the separating partition in place, such that the upper electrode includes a first electrode region and a second electrode region that are electrically isolated from each other.

A signal applied to the second electrode region of the upper electrode is different from a signal applied to the first electrode region of the upper electrode.

The first electrode region of the upper electrode is selectively connected to a touch sensing part by the first link wire.

The encapsulating element includes a first encapsulating layer, a second encapsulating layer and a third encapsulating layer, which are sequentially stacked, the second encapsulating layer including a material different from the first encapsulating layer and the third encapsulating layer.

At least one encapsulating dam is disposed on the device substrate. The first encapsulating layer and the third encapsulating layer extend along a surface of the encapsulating dam, and the second encapsulating layer is disposed on a portion between the first encapsulating layer and the third encapsulating layer. The portion is defined by (e.g., laterally surrounded by) the encapsulating dam.

The upper electrode and the touch wire may extend in different directions.

A separating partition may be disposed on the bank insulating layer. The separating partition may have a reverse taper. The separating partition may be disposed between the first electrode region and the second electrode region of the upper electrode.

The separating portion may surround the emission area.

The first electrode region may have a larger size than the emission area.

The second electrode region may include the same material or substantially the same material as the first electrode region.

The second link wire may be disposed between the device substrate and the bank insulating layer.

The second link wire may include the same material or substantially the same material as the first link wire.

The second link wire may extend parallel to the first link wire.

Each of the first link wire and the second link wire may include a portion overlapping with the touch wire.

It is to be understood that both the foregoing general description and the following detailed description are examples and explanatory and are intended to provide further explanation of the embodiments as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

Throughout the drawings and the detailed description, unless otherwise described, the same drawing reference numerals should be understood to refer to the same elements, features, and structures.

DETAILED DESCRIPTION

Figure 1:
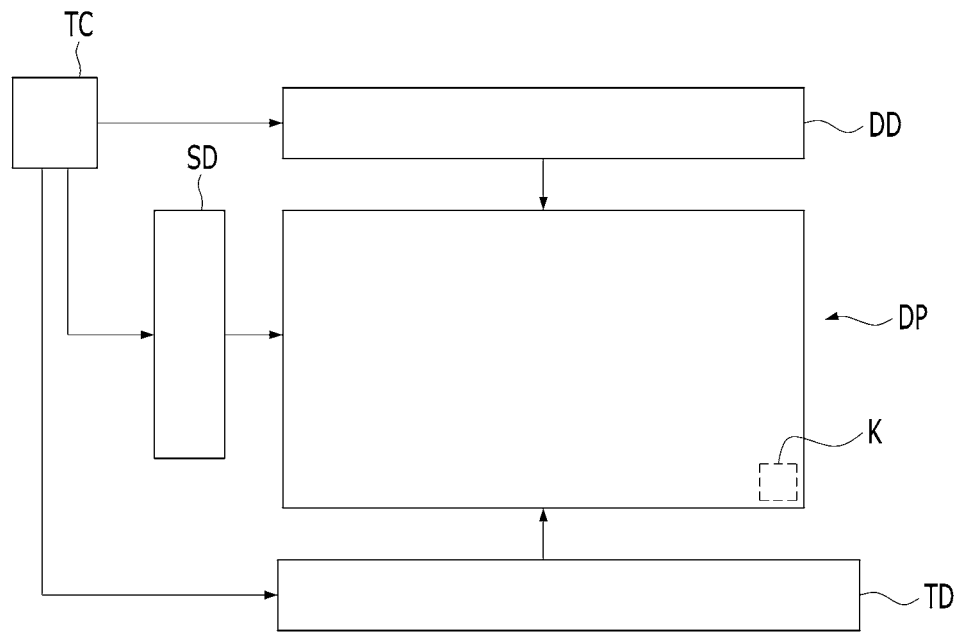
FIG. 1 is a view schematically showing a touch display apparatus according to one or more embodiments of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
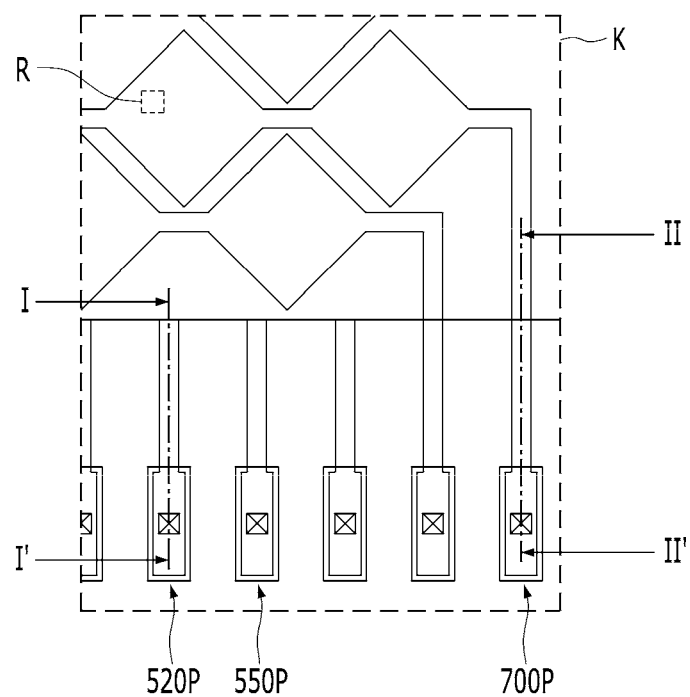
FIG. 2 is an enlarged view of K region in FIG. 1.
Figure 3:
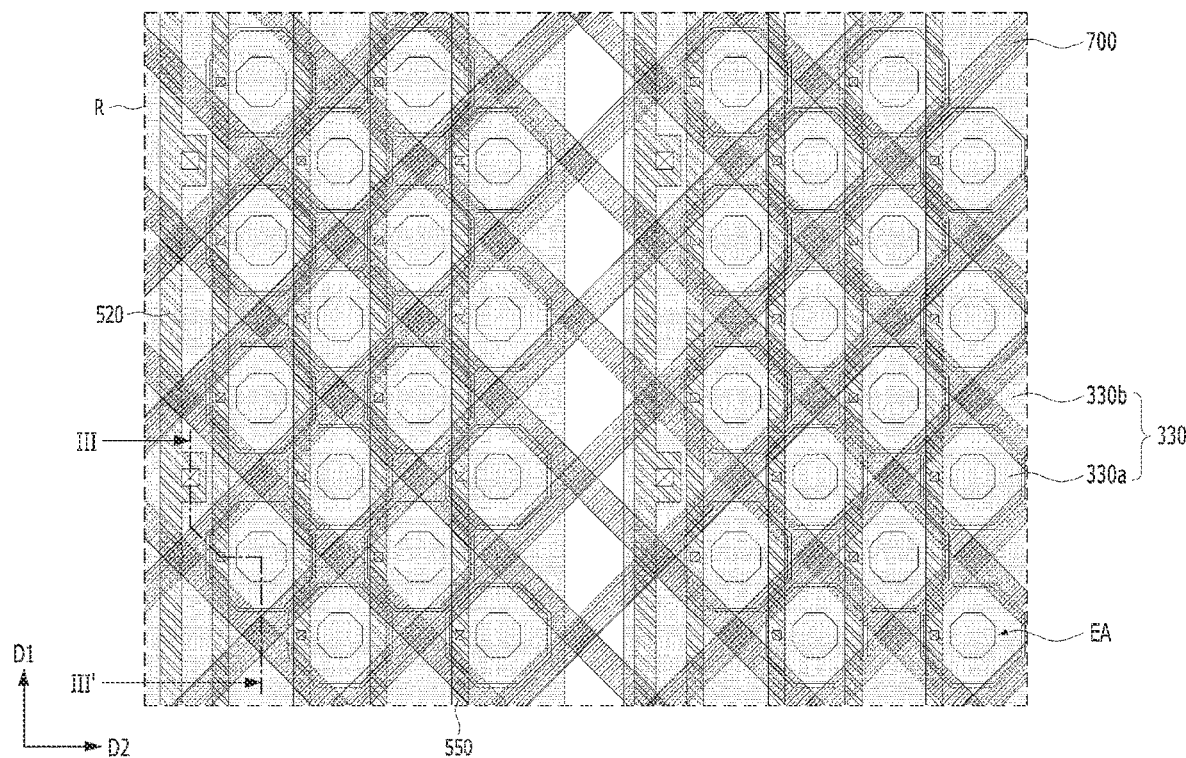
FIG. 3 is an enlarged view of R region in FIG. 2.
Figure 4:
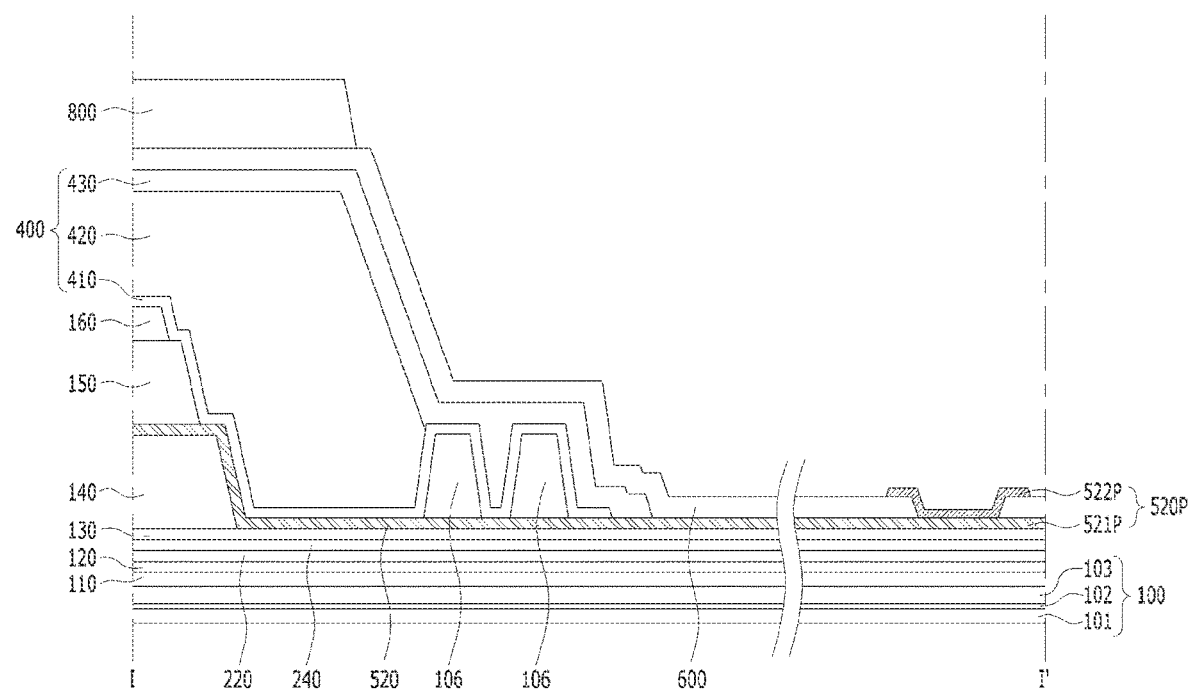
FIG. 4 is a view taken along I-I' of FIG. 2.
Figure 5:
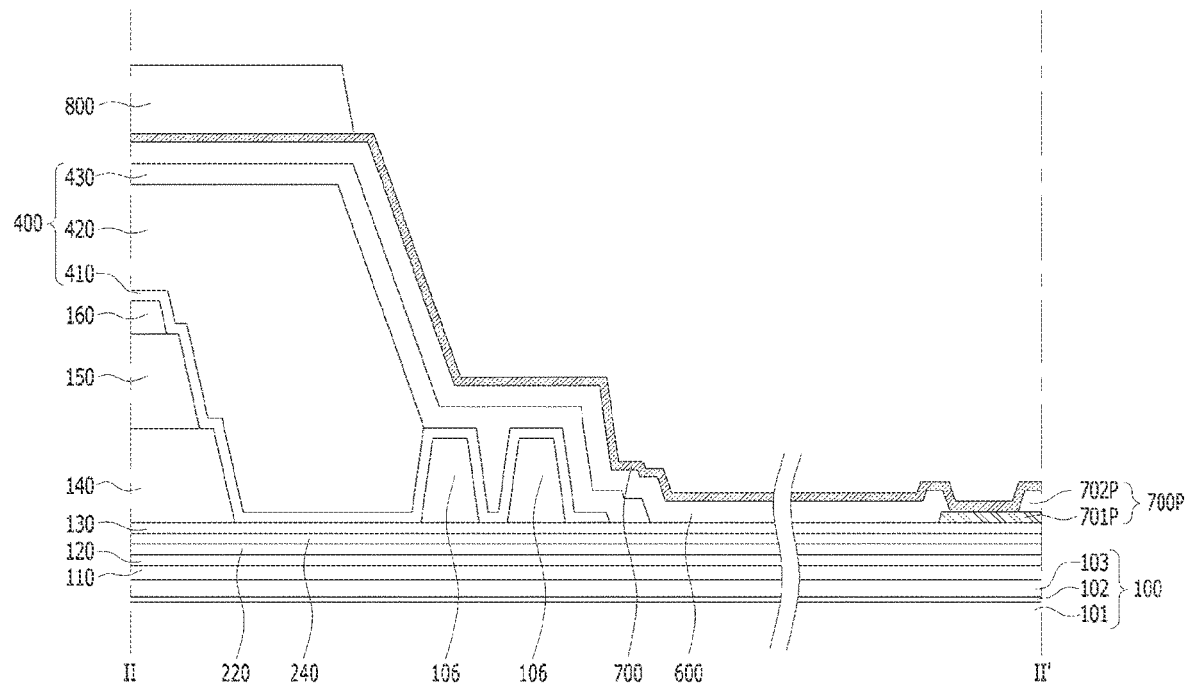
FIG. 5 is a view taken along II-II' of FIG. 2.
Figure 6:
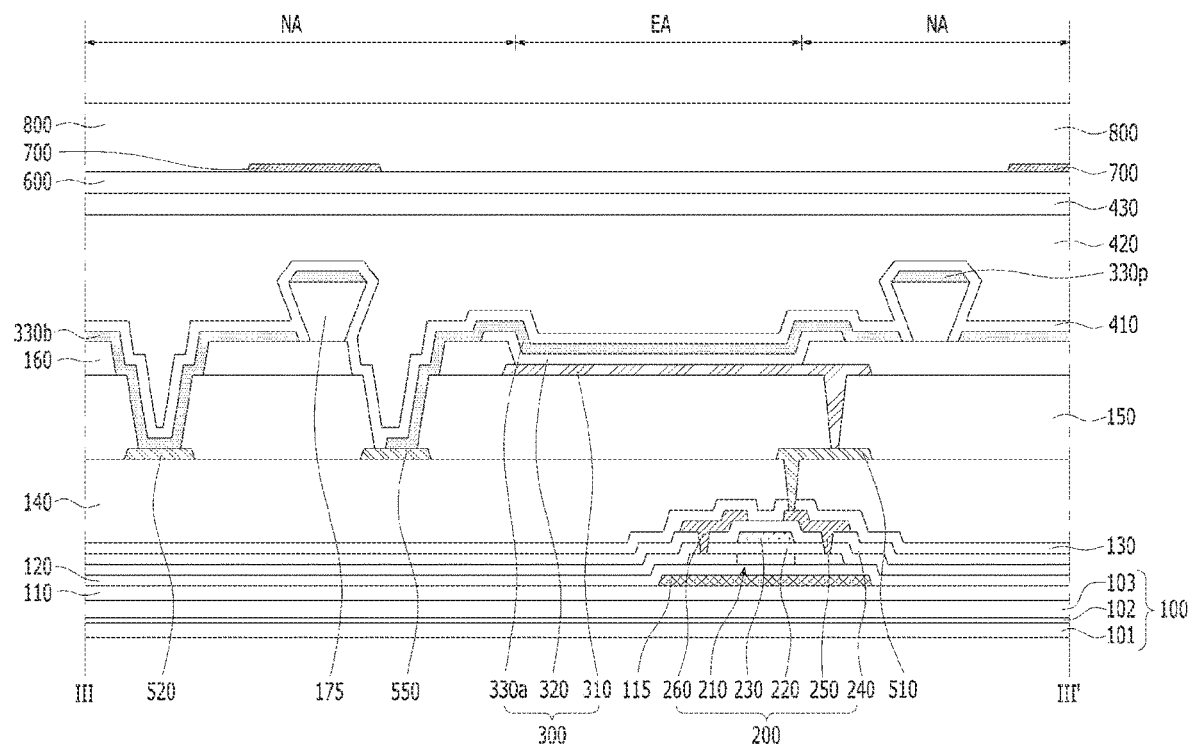
FIG. 6 is a view taken along III-III' of FIG. 3.

FIG. 1 is a view schematically showing a touch display apparatus according to one or more embodiments of the present disclosure. FIG. 2 is an enlarged view of K region in FIG. 1. FIG. 3 is an enlarged view of R region in FIG. 2. FIG. 4 is a view taken along I-I' of FIG. 2. FIG. 5 is a view taken along II-II' of FIG. 2. FIG. 6 is a view taken along III-III' of FIG. 3.

Referring to FIGS. 1 to 6, the touch display apparatus according to embodiment of the present disclosure may include a display panel DP and driving parts DD, SD, TD and TC. The driving parts DD, SD, TD and TC may provide various signals for realizing an image to the display panel DP. For example, the driving parts DD, SD, TD and TC may include a data driver DD applying a data signal, a scan driver SD applying a scan signal and a timing controller TC. The timing controller TC may apply a digital video data and a source timing control signal to the data driver DD, and apply clock signals, reverse clock signals and start signals to the scan driver SD. The driving parts DD, SD, TD and TC may be driving circuitry, and may be referred to as the driving circuitry DD, SD, TD and TC, such as the data driving circuitry DD, the scan driving circuitry SD, the touch driving circuitry TD, and the touch controller circuitry TC.

The display panel DP may generate an image provided to (e.g., viewable by) a user. For example, the display panel DP may include light-emitting devices 300 on a device substrate 100. The device substrate 100 may have a multi-layer structure. For example, the device substrate 100 may have a stacked structure of a first substrate layer 101, a substrate insulating layer 102 and a second substrate layer 103 (see, for example, FIG. 6). The second substrate layer 103 may include the same material or substantially the same material as the first substrate layer 101. For example, the first substrate layer 101 and the second substrate layer 103 may include a polymer material, such as poly-imide (PI). The substrate insulating layer 102 may include an insulating material. Thus, in the touch display apparatus according to the embodiment of the present disclosure, the device substrate 100 may have high flexibility. Therefore, in the touch display apparatus according to the embodiment of the present disclosure, the damage of the light-emitting devices 300 due to an external impact may be prevented.

The device substrate 100 may include emission areas EA and a non-emission area NA (see, for example, FIG. 6). The non-emission area NA may be disposed outside the emission areas EA. For example, each of the emission areas EA may be surrounded by the non-emission area NA.

Driving circuits may be disposed on the device substrate 100. Each of the driving circuits may be electrically connected to one of the light-emitting devices 300. Each of the driving circuits may be controlled by signals transmitted from the driving parts DD, SD, TD and TC. For example, each of the driving circuits may provide a driving current corresponding to the data signal to the corresponding light-emitting device 300 according to the scan signal. Each of the driving circuits may include at least one thin film transistor 200 (see, for example, FIG. 6). For example, the thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or polycrystalline silicon (poly-Si). The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a lower resistance than the channel region.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include silicon oxide (SiO) and/or silicon nitride (SiN). The gate insulating layer 220 may include a material having a high dielectric constant. For example, the gate insulating layer 220 may include a high-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chrome (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have electrical conductivity corresponding to a voltage applied to the gate electrode 230.

The interlayer insulating layer 240 may be disposed on the gate electrode 230. The interlayer insulating layer 240 may extend beyond the gate electrode 230. For example, a side of the gate electrode 230 may be covered by the interlayer insulating layer 240. The interlayer insulating layer 240 may be in direct contact with the gate insulating layer 220 at the outside of the gate electrode 230. The interlayer insulating layer 240 may include an insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo) and tungsten (W). The source electrode 250 may be insulated from the gate electrode 230 by the interlayer insulating layer 240. For example, the source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 within the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material or substantially the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 within the drain contact hole.

A first buffer layer 110 may be disposed between the device substrate 100 and the driving circuits. The first buffer layer 110 may prevent pollution due to the device substrate 100 in a process of forming the thin film transistors 200. For example, the first buffer layer 110 may completely cover an upper surface of the device substrate 100 toward the light-emitting devices 300. The first buffer layer 110 may include an insulating material. For example, the first buffer layer 110 may include silicon oxide (SiO) and/or silicon nitride (SiN). The first buffer layer 110 may have a multi-layer structure.

A light-blocking pattern 115 may be disposed between the first buffer layer 110 and each thin film transistor 200. The light-blocking pattern 115 may prevent characteristics change of each thin film transistor 200 due to external light. For example, the light-blocking pattern 115 may include a portion overlapping with the semiconductor pattern 210 of each thin film transistor 200. The light-blocking pattern 115 may include a material that blocks or absorbs the light. For example, the light-blocking pattern 115 may include a metal, such as aluminum (Al), silver (Ag) and copper (Cu).

The light-blocking pattern 115 may be insulated from the semiconductor pattern 210 of each thin film transistor 200. For example, a second buffer layer 120 may be disposed between the light-blocking pattern 115 and the thin film transistors 200. The second buffer layer 120 may include an insulating material. For example, the second buffer layer 120 may include silicon oxide (SiO) or silicon nitride (SiN). The second buffer layer 120 may include the same material or substantially the same material as the first buffer layer 110. The second buffer layer 12 may extend beyond the light-blocking pattern 115. For example, the second buffer layer 120 may be in direct contact with the first buffer layer 110 at the outside of the light-blocking pattern 115.

A lower passivation layer 130 may be disposed on the driving circuits. The lower passivation layer 130 may prevent the damage of the driving circuits due to the external impact and moisture. For example, an upper surface of each thin film transistor 200 opposite to the device substrate 100 may be covered by the lower passivation layer 130. The lower passivation layer 130 may include an insulating material. For example, the lower passivation layer 130 may include an inorganic insulating material, such as silicon oxide (SiO) and silicon nitride (SiN).

A lower planarization layer 140 and an upper planarization layer 150 may be sequentially stacked on the lower passivation layer 130. The lower planarization layer 140 and the upper planarization layer 150 may remove a thickness difference due to the driving circuits. For example, an upper surface of the upper planarization layer 150 toward the light-emitting devices 300 may be a flat surface. The lower planarization layer 140 and the upper planarization layer 150 may include an insulating material. For example, the lower planarization layer 140 and the upper planarization layer 150 may include organic insulating material. The upper planarization layer 150 may include a material different from the lower planarization layer 140. Thus, in the touch display apparatus according to the embodiment of the present disclosure, the thickness difference due to the driving circuits may be effectively removed.

The light-emitting devices 300 may be disposed on the upper planarization layer 150. Each of the light-emitting devices 300 may emit light displaying a specific color. For example, each of the light-emitting devices 300 may include a pixel electrode 310, a light-emitting layer 320 and an upper electrode 330, which are sequentially stacked on the upper planarization layer 150.

The pixel electrode 310 may include a conductive material. The pixel electrode 310 may have a high reflectance. For example, the pixel electrode 310 may include a metal, such as aluminum (Al) and silver (Ag). The pixel electrode 310 may have a multi-layer structure. For example, the pixel electrode 310 may have a structure in which a reflective electrode including a metal is disposed between transparent electrodes including a transparent conductive material, such as ITO and IZO.

The light-emitting layer 320 may generate light having luminance corresponding to a voltage difference between the pixel electrode 310 and the upper electrode 330. For example, the light-emitting layer 320 may include an emission material layer (EML) including an emission material. The emission material may include an organic material, an inorganic material or a hybrid material. For example, the touch display apparatus according to the embodiment of the present disclosure may be an organic light-emitting display apparatus including the emission material layer including an organic material. The light-emitting layer 320 may have a multi-layer structure. For example, the light-emitting layer 320 may include at least one of a hole injection layer (HIL), a hole transmitting layer (HTL), an electron transmitting layer (ETL) and an electron injection layer (EIL). Thus, in the touch display apparatus according to the embodiment of the present disclosure, the luminous efficiency of each light-emitting devices 300 may be increased.

The upper electrode 330 may include a conductive material. The upper electrode 330 may include a material different from the pixel electrode 310. The upper electrode 330 may have a higher transmittance than the pixel electrode 310. For example, the upper electrode 330 may be a transparent electrode including a transparent conductive material, such as ITO and IZO. Thus, in the touch display apparatus according to the embodiment of the present disclosure, the light generated from the light-emitting layer 320 may be emitted to the outside through the upper electrode 330.

The light-emitting devices 300 may overlap the emission areas EA of the device substrate 100. For example, the pixel electrode 310, the light-emitting layer 320 and the upper electrode 330 of each light-emitting device 300 may be stacked on one of the emission areas EA. A bank insulating layer 160 may be disposed on the upper planarization layer 150. The bank insulating layer 160 may include an insulating material. For example, the bank insulating layer 160 may include an organic insulating material. The bank insulating layer 160 may include a material different from the lower planarization layer 140 and the upper planarization layer 150. The bank insulating layer 160 may define (e.g., border) the emission areas EA. For example, the bank insulating layer 160 may cover an edge of the pixel electrode 310 of each light-emitting device 300. The light-emitting layer 320 and the upper electrode 330 of each light-emitting device 300 may be stacked on a portion of the corresponding pixel electrode 310 exposed by the bank insulating layer 160. The non-emission area NA of the device substrate 100 may overlap the bank insulating layer 160.

The pixel electrode 310 of each light-emitting device 300 may be electrically connected to one of the thin film transistors 200. Intermediate electrodes 510 may be disposed between the lower planarization layer 140 and the upper planarization layer 150. The intermediate electrodes 510 may include a conductive material. For example, the intermediate electrodes 510 may include a metal, such as aluminum (Al), titanium (Ti), copper (Cu), chrome (Cr), molybdenum (Mo) and tungsten (W). Each of the intermediate electrodes 510 may be electrically connected to the drain electrode 260 of one of the thin film transistors 200 by penetrating the lower planarization layer 140. For example, the pixel electrode 310 of each light-emitting device 300 may be connected to the corresponding thin film transistor 200 through the one of the intermediate electrodes 510. Each of the intermediate electrodes 510 may include a portion overlapping with the drain electrode 260 of one of the thin film transistors 200 and a portion overlapping with the pixel electrode 310 of one of the light-emitting devices 300. For example, the pixel electrode 310 of each light-emitting device 300 may be connected to the corresponding intermediate electrode 510 by penetrating the upper planarization layer 150.

The light emitted from each light-emitting device 300 may display a color different from the light emitted from one or more adjacent light-emitting devices 300. For example, the light-emitting layer 320 of each light-emitting device 300 may include a material different from the light-emitting layer 320 of the adjacent light-emitting device or devices 300. The light-emitting layer 320 of each light-emitting device 300 may be spaced away from the light-emitting layer 320 of the adjacent light-emitting device or devices 300. For example, the light-emitting layer 320 of each light-emitting device 300 may include an end which is disposed on the bank insulating layer 160.

A voltage applied to the upper electrode 330 of each light-emitting device 300 may be the same as a voltage applied to the upper electrode 330 of adjacent light-emitting device or devices 300. For example, the upper electrode 330 of each light-emitting device 300 may be electrically connected to the upper electrode 330 of adjacent light-emitting device or devices 300. The upper electrode 330 of each light-emitting device 300 may include the same material or substantially the same material as the upper electrode 330 of adjacent light-emitting device or devices 300. For example, the upper electrode 330 of each light-emitting device 300 may be formed simultaneously with the upper electrode 330 of adjacent light-emitting device or devices 300.

Each of the upper electrodes 330 may extend in a first direction (see, for example, FIG. 3; e.g., D1). Each of the upper electrodes 330 may be separated from adjacent upper electrodes 330 in a second direction (e.g., D2) perpendicular to the first direction. For example, in the touch display apparatus according to the embodiment of the present disclosure, the upper electrodes 330 extending in the first direction may be arranged side by side in the second direction. Each of the upper electrode 330 may overlap a plurality of the emission areas EA. For example, each of the upper electrodes 330 may include first electrode regions 330a overlapping with the emission areas EA and a second electrode region 330b disposed outside the emission areas EA. One of the first electrode regions 330a may be disposed on the light-emitting layer 320 of each respective light-emitting device 300. The second electrode region 330b may be disposed on the non-emission area NA of the device substrate 100. For example, the second electrode region 330b may be disposed on the bank insulating layer 160.

The second electrode region 330b may be separated from the first electrode regions 330a. For example, separating partitions 175 may be disposed between the first electrode regions 330a and the second electrode region 330b (see, for example, FIG. 6). Each of the separating partitions 175 may have a side of reverse taper. Thus, in the touch display apparatus according to the embodiment of the present disclosure, the first electrode regions 330a and the second electrode region 330b of each upper electrode 330 may be simultaneously formed without an additional patterning process. For example, the first electrode regions 330a and the second electrode region 330b of each upper electrode 330 may include the same material or substantially the same material. An electrode pattern 330p including the same material or substantially the same material as the first electrode regions 330a and the second electrode region 330b may be disposed on an upper surface of each separating partition 175 opposite to the device substrate 100. The separating partitions 175 may be disposed on the bank insulating layer 160. Each of the separating partitions 175 may extend between one of the first electrode regions 330a and the second electrode region 330b. For example, each of the separating partitions 175 may surround one of the emission areas EA. A size of each first electrode region 330a may be larger than a size of the corresponding emission area EA. Each of the first electrode regions 330a may be surrounded by the second electrode region 330b. Therefore, in the touch display apparatus according to the embodiment of the present disclosure, the process efficiency may be improved. It should be appreciated that "reverse taper" includes the meaning of width that increases with distance from the substrate 100. For example, the separating partitions 175 shown in FIG. 6 have a reverse taper shape, in which the width of the separating partitions 175 along the horizontal axis (relative to the page) increases with distance from the substrate 100 along the vertical axis, which is perpendicular to the horizontal axis. The vertical axis may be normal to the major surface of the substrate 100, and the horizontal axis may be perpendicular to the vertical axis and parallel with the major surface of the substrate 100. The reverse taper shape of the partitions 175 allows the first electrode regions 330a and the second electrode regions 330b to be deposited in a single operation. For example, a layer of material of the first and second electrode regions 330a, 330b may be deposited conformally over the features of the intermediate structure including the partitions 175. The presence of the partitions 175 having the reverse taper shape establishes discontinuity in the layer of material, as the material is less likely to collect on the angled sidewalls of the partitions 175. If the partitions 175 had a tapered shape (e.g., width increases with reduced distance from the substrate 100), the material would collect on the sidewalls of the partitions 175, and the layer of material would be continuous, which would form electrical connection (e.g., a conductive bridge) between the first electrode regions 330a and the second electrode regions 330b on either side of the partitions 175. As shown in FIG. 6, the first electrode regions 330a are electrically isolated from the second electrode region 330b.

The separating partitions 175 may include an insulating material. For example, the separating partitions 175 may include an organic insulating material. Each of the separating partitions 175 may have a multi-layer structure. For example, each of the separating partitions 175 may have a stacked structure of layers which have an etch selectivity.

First link wires 550 may be disposed between the lower planarization layer 140 and the upper planarization layer 150. The first electrode regions 330 a of each upper electrode 330 may be electrically connected to the one of the first link wires 550. For example, the upper planarization layer 150 and the bank insulating layer 160 may include first electrode contact holes exposing a portion of each first link wire 550. Each of the first electrode regions 330 a may include a portion overlapping with one of the first electrode contact holes. For example, each of the first electrode regions 330 a may be in direct contact with the corresponding first link wire 550 through one of the first electrode contact holes. The first link wires 550 may extend in the first direction. For example, each of the first electrode regions 330 a may be connected to the same first link wire 550 as the first electrode region 330 a which is disposed adjacent in the first direction.

The first link wires 550 may include a conductive material. For example, the first link wires 550 may include a metal, such as aluminum (Al), titanium (Ti), copper (Cu), chrome (Cr), molybdenum (Mo) and tungsten (W). The first link wires 550 may include the same material or substantially the same material as the intermediate electrodes 510. The first link wires 550 may insulated from the intermediate electrodes 510. For example, the first link wires 550 may be spaced away from the intermediate electrodes 510 in the second direction.

Second link wires 520 may be disposed between the lower planarization layer 140 and the upper planarization layer 150. The second link wires 520 may include a conductive material. For example, the second link wires 520 may include a metal, such as aluminum (Al), titanium (Ti), copper (Cu), chrome (Cr), molybdenum (Mo) and tungsten (W). The second link wires 520 may include the same material or substantially the same material as the intermediate electrodes 510 and the first link wires 550. The second link wires 520 may extend parallel to the first link wires 550. For example, the second link wires 520 may extend in the first direction. The second link wires 520 may be spaced away from the intermediate electrodes 510 and the first link wires 550.

Each of the second link wires 520 may be electrically connected to the second electrode region 330b of one of the upper electrodes 330. For example, the upper planarization layer 150 and the bank insulating layer 160 may include second electrode contact holes exposing a portion of each second link wire 520. The second electrode region 330b of each upper electrode 330 may include a portion overlapping with one of the second link wires 520. For example, the second electrode region 330b of each upper electrode 330 may be in direct contact with the corresponding second link wire 520 through one of the second electrode contact holes. Thus, in the touch display apparatus according to the embodiment of the present disclosure, a signal applied to the second electrode region 330b of each upper electrode 330 may be different from a signal applied to the first electrode regions 330a of the corresponding upper electrode 330.

An encapsulating element 400 may be disposed on the upper electrodes 330 and the separating partitions 175. The encapsulating element 400 may prevent the damage of the light-emitting devices 300 due to the external impact and moisture. The encapsulating element 400 may have a multi-layer structure. For example, the encapsulating element 400 may include a first encapsulating layer 410, a second encapsulating layer 420 and the third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the touch display apparatus according to the embodiment of the present disclosure, the damage of the light-emitting devices 300 due to the external impact and moisture may be effectively prevented. A thickness difference due to the light-emitting devices 300 and the separating partitions 175 may be removed by the second encapsulating layer 420. For example, an upper surface of the encapsulating element 400 opposite to the device substrate 100 may be a flat surface. The side of each separating partition 175 having reverse taper may be covered by the encapsulating element 400.

At least one encapsulating dam 106 may be disposed on the device substrate 100. The encapsulating dam 106 may block the flow of the second encapsulating layer 420 having a relatively high fluidity. For example, the second encapsulating layer 420 may be disposed on a portion of the device substrate 100 which is defined by (e.g., laterally surrounded by) the encapsulating dam 106. The first encapsulating layer 410 and the third encapsulating layer 430 may extend along a surface of the encapsulating dam 106. For example, the third encapsulating layer 430 may be in direct contact with the first encapsulating layer 410 at the outside of the encapsulating dam 106. The encapsulating dam 106 may include an insulating material. For example, the encapsulating dam 106 may include an organic insulating material. The encapsulating dam 106 may be disposed on the lower passivation layer 130. For example, the encapsulating dam 106 may include the same material or substantially the same material as the lower planarization layer 140 or the upper planarization layer 140. Thus, in the touch display apparatus according to the embodiment of the present disclosure, the process efficiency may be improved.

The touch display apparatus according to the embodiment of the present disclosure may sense a touch of the user and/or a tool. For example, the driving parts DD, SD, TD and TC may include a touch sensing part TD. Touch wires 700 being electrically connected to the touch sensing part TD and a cover insulating layer 800 which is disposed on the touch wires 700 may be disposed on the encapsulating element 400. The touch wires 700 may include a conductive material. For example, the touch wires 700 may include a metal, such as such chrome (Cr), molybdenum (Mo) and tungsten (W). A touch buffer layer 600 may be disposed between the encapsulating element 400 and the touch wires 700. The touch buffer layer 600 may prevent the damage of the light-emitting devices 300 in a process of forming the touch wires 700. The touch buffer layer 600 may include an insulating material. For example, the touch buffer layer 600 may include an inorganic insulating material, such as silicon oxide (SiO) and silicon nitride (SiN). The cover insulating layer 800 may include an insulating material. The cover insulating layer 800 may include a material different from the touch buffer layer 600. For example, the cover insulating layer 800 may include an organic insulating material. A thickness difference due to the touch wires 700 may be removed by the cover insulating layer 800.

Each of the touch wires 700 may include a portion overlapping with the second electrode region 330b of each upper electrode 330. The touch wires 700 may extend in a direction different from the upper electrodes 330. For example, each of the touch wires 700 may extend in the second direction. The touch wires 700 may be disposed outside the emission areas EA. For example, each of the touch wires 700 may extend between the emission areas EA. The emission areas EA may be arranged in a zig-zag shape. Each of the touch wires 700 may extend in a zig-zag shape. Each of the touch wires 700 may include a portion overlapping with the second electrode region 330b of each upper electrode 330. The first link wires 550 and the second link wires 520 may overlap the touch wires 700. For example, each of the touch wires 700 may include a portion overlapping with the first link wires 550 and the second link wires 520.

The second link wires 520 may be electrically connected to the touch sensing part TD. The touch sensing part TD may apply a touch driving signal Tx and a touch sensing signal Rx to the display panel DP. For example, the touch driving signal Tx may be applied to the second electrode region 330b of each upper electrode 330 by the second link wires 520, and the touch sensing signal Rx may be applied to each touch wire 700. The first link wires 550 may be electrically connected to the power voltage supply source. That is, the touch display apparatus according to the embodiment of the present disclosure may provide the power voltage to the first electrode regions 330a of each upper electrode 330 which are disposed on the light-emitting layer 320 of each light-emitting device 300, and sense the touch of the user and/or the tool by using the second electrode region 330b of each upper electrode 330 and the touch wires 700. Thus, in the touch display apparatus according to the embodiment of the present disclosure, realizing the image by the light-emitting device 300 and sensing the touch may be performed, simultaneously.

Accordingly, the touch display apparatus according to the embodiment of the present disclosure may sense the touch of the user and/or the tool by using the second electrode region 330b of each upper electrode 330 and the touch wires 700, wherein the second electrode region 330b of each upper electrode 300 may be disposed between the non-emission area NA of the device substrate 100 and the encapsulating element 400, and wherein the touch wires 700 may be disposed on the encapsulating element 400. Thus, in the touch display apparatus according to the embodiment of the present disclosure, a process of forming the touch wires 700 which are disposed on the encapsulating element 400 may be simplified. Therefore, in the touch display apparatus according to the embodiment of the present disclosure, the process efficiency may be improved.

The display panel DP may be electrically connected to the driving parts DD, SD, TD and TC by pads 520P, 550P and 700P, as shown in FIG. 2. For example, first link pads 550P electrically connected to the first link wires 550, second link pads 520P electrically connected to the second link wires 520 and touch pads 700P electrically connected to the touch wires 700 may be disposed on a portion of the device substrate 100. The first link pads 550P, the second link pads 520P and the touch pads 700P may be disposed outside the encapsulating dam 106. For example, the first link pads 550P, the second link pads 520P and the touch pads 700P may be spaced away from the encapsulating element 400.

Each of the first link wires 550 may be connected to one of the first link pads 550P by extending along the lower passivation layer 130. For example, each of the first link pads 550P may include a first lower link pad which has the same material or substantially the same material as the first link wires 550. The touch buffer layer 600 may extend beyond the encapsulating dam 106. For example, the touch buffer layer 600 may include first pad contact holes partially exposing the first lower link pad of each first link pads 550P. Each of first link pads 550P may include a first upper link pad which is disposed on the touch buffer layer 600. The first upper link pad of each first link pad 550P may be connected to the first lower link pad of the corresponding first link pad 550P through one of the first pad contact holes. The first upper link pad of each first link pad 550P may include a conductive material. For example, the first upper link pad of each first link pad 550P may include a metal, such as aluminum (Al), titanium (Ti), copper (Cu), chrome (Cr), molybdenum (Mo) and tungsten (W). The first upper link pad of each first link pad 550P may include the same material or substantially the same material as a conductive layer which is disposed on the first link wires 550. For example, the first upper link pad of each first link pad 550P may include the same material or substantially the same material as the touch wires 700.

Referring to FIG. 4, each of the second link wires 520 may be connected to one of the second link pads 520P by extending along the lower passivation layer 130. Each of the second link pads 520P may have a stacked structure same as the first link pads 550P. For example, each of second link pads 520P may have a stacked structure of a second lower link pad 521P and a second upper link pad 522P. The second lower link pad 521P of each second link pad 520P may include the same material or substantially the same material as the second link wires 520. The second upper link pad 522P of each second link pad 520P may include the same material or substantially the same material as the touch wires 700. For example, the touch buffer layer 600 may include second pad contact holes exposing a portion of each second lower link pad 521P. The second upper link pad 522P of each second link pad 520P may be connected to the second lower link pad 521P of the corresponding second link pad 520P through one of the second pad contact holes.

Referring to FIG. 5, each of the touch wires 700 may be connected to one of the touch pads 700P by extending along the touch buffer layer 600. For example, each of the touch wires 700 may extend beyond the encapsulating dam 106 along a surface of the encapsulating element 400 which is opposite to the device substrate 100. Each of the touch pads 700P may have a stacked structure same as the first link pads 550P and the second link pads 520P. For example, each of the touch pads 700P may have a stacked structure of a lower touch pad 701P and an upper touch pad 702P. The lower touch pad 701P of each touch pad 700P may be disposed on the same layer as the first lower link pads. For example, the lower touch pad 701P of each touch pad 700P may be disposed between the lower passivation layer 130 and the touch buffer layer 600. The lower touch pad 701P of each touch pad 700P may include the same material or substantially the same material as the first lower link pads. The touch buffer layer 600 may include touch pad contact holes partially exposing the lower touch pad 701P of each touch pad 700P. The upper touch pad 702P of each touch pad 700P may be disposed on the touch buffer layer 600. For example, the upper touch pad 702P of each touch pad 700P may be connected to the lower touch pad 701P of the corresponding touch pad 700P through one of the touch pad contact holes. The upper touch pad 702P of each touch pad 700P may include the same material or substantially the same material as the touch wires 700. For example, the upper touch pad 702P of each touch pad 700P may be in direct contact with the corresponding touch wire 700.

The touch display apparatus according to the embodiment of the present disclosure is described that realizing the image and sensing the touch are simultaneously performed. However, in the touch display apparatus according to another embodiment of the present disclosure, the first electrode regions 330a of each upper electrode 330 may be selectively connected to the touch sensing part TD by the first link wires 550, and the second electrode regions 330b of each upper electrode 330 may be connected to the touch sensing part TD by the second link wires 520. For example, in the touch display apparatus according to another embodiment of the present disclosure, both of the first electrode regions 330a and the second electrode region 330b of each upper electrode 330 may be used as touch electrodes. For example, in the touch display apparatus according to another embodiment of the present disclosure, each frame may be divided into a display period and a touch period. During the display period of each frame, the power voltage may be supplied to the first electrode regions 330a of each upper electrode 330. During the touch period of each frame, the touch driving signal Tx may be applied to the first electrode regions 330a and the second electrode region 330b of each upper electrode 330, and the touch sensing signal Rx may be applied to the touch wires 700 which are disposed on the encapsulating element 400. Thus, in the touch display apparatus according to another embodiment of the present disclosure, the accuracy of touch sensing may be improved.

Figure 7:
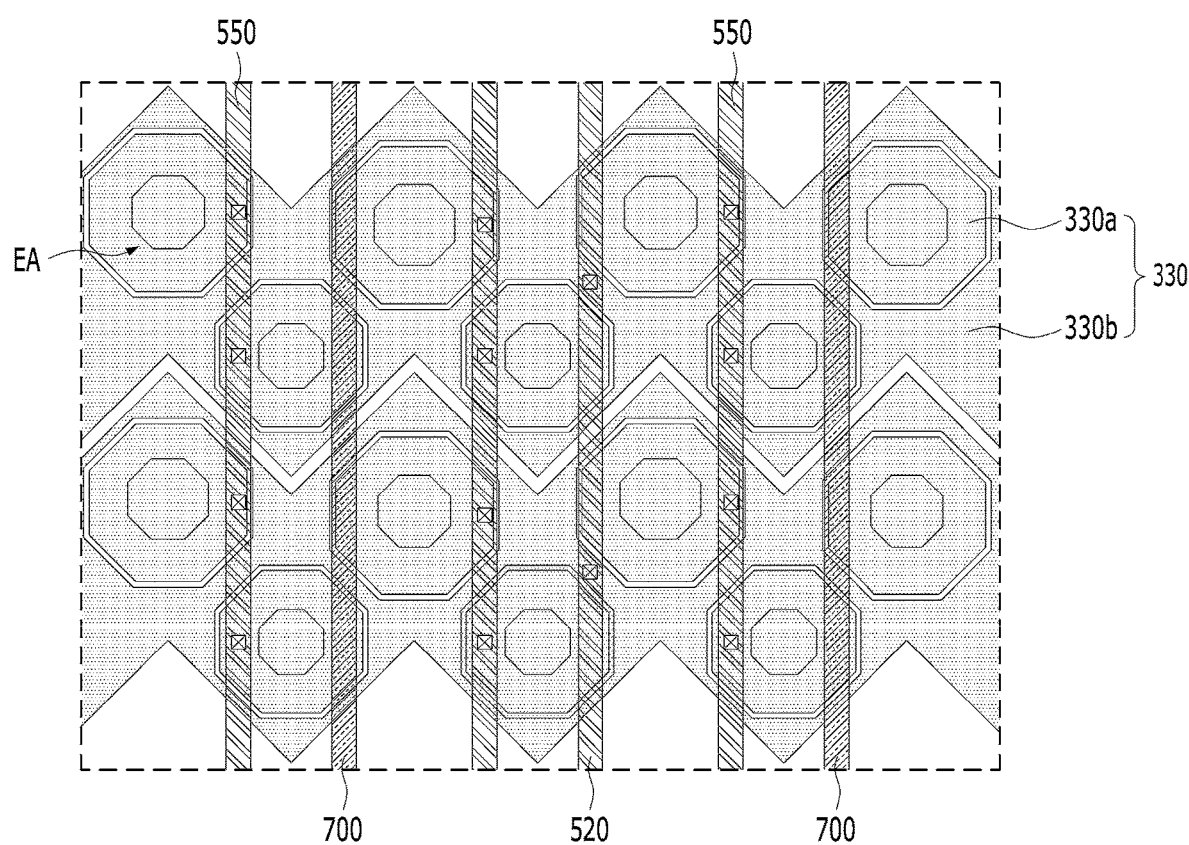
FIG. 7 is a view showing the touch display apparatus according another embodiment of the present disclosure.

The touch display apparatus according to the embodiment of the present disclosure is described that the upper electrodes 330 extend in the same direction as the first link wires 550 and the second link wires 520. However, in the touch display apparatus according to another embodiment of the present disclosure, the upper electrodes 330 and the touch wires 700 may be arranged in various shape. For example, the touch display apparatus according to another embodiment of the present disclosure may include the touch wires 700 which extend parallel to the first link wires 550 and the second link wires 520, as shown in FIG. 7. The second electrode region 330b of each upper electrode 330 may extend in a direction perpendicular to the first link wires 550 and the second link wires 520. For example, the second electrode region 330b of each upper electrode 330 may extend in a zig-zag shape. Thus, in the touch display apparatus according to another embodiment of the present disclosure, the degree of freedom for the arrangement of the touch wires 700 may be improved. Therefore, in the touch display apparatus according to another embodiment of the present disclosure, a process for sensing the touch may be simplified without decreasing the process efficiency.

The touch display apparatus according to the embodiment of the present disclosure may comprise a device substrate including an emission area; a pixel electrode on the emission area of the device substrate; a bank insulating layer on the device substrate, the bank insulating layer covering an edge of the pixel electrode; a light-emitting layer on a portion of the pixel electrode exposed by the bank insulating layer; an upper electrode including a first electrode region on the emission area, and a second electrode region being spaced away from the first electrode region; a first link wire disposed between the device substrate and the bank insulating layer, the first link wire being electrically connected to the first electrode region; a second link wire being spaced away from the first link wire, the second link wire being electrically connected to the second electrode region; an encapsulating element on the upper electrode; and a touch wire on the encapsulating element, the touch wire being spaced away from the emission area, wherein the touch wire includes a portion overlapping with the second electrode region.

In the result, the touch display apparatus according to the embodiments of the present disclosure may include the upper electrode on each light-emitting layer, the encapsulating element on the upper electrode and the touch wire on the encapsulating element, wherein the upper electrode may include the first electrode regions which is disposed on the emission area, and the second electrode region being spaced away from the first electrode regions, wherein the touch wire includes a portion overlapping with the second electrode region. Thus, the touch display apparatus according to the embodiments of the present disclosure may sense the touch of the user and/or the tool by the second electrode region of the upper electrode and the touch wire. For example, in the touch display apparatus according to the embodiments of the present disclosure, the degree of freedom for the touch wire may be improved. Thereby, in the touch display apparatus according to the embodiments of the present disclosure, the process of forming components for sensing the touch may be simplified.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display apparatus comprising:
   a device substrate including an emission area;
   a pixel electrode on the emission area of the device substrate;
   a bank insulating layer on the device substrate, the bank insulating layer covering an edge of the pixel electrode;
   a light-emitting layer on a portion of the pixel electrode, the portion being exposed by the bank insulating layer;
   an upper electrode including:
      a first electrode region on the emission area, and
      a second electrode region being spaced away from the first electrode region;
   a first link wire disposed between the device substrate and the bank insulating layer, the first link wire being electrically connected to the first electrode region;
   a second link wire being spaced away from the first link wire, the second link wire being electrically connected to the second electrode region;
   an encapsulating element on the upper electrode; and
   a touch wire on the encapsulating element, the touch wire being spaced away from the emission area,
   wherein the touch wire includes a portion overlapping with the second electrode region.

2. The touch display apparatus according to claim 1, wherein a signal applied to the second electrode region of the upper electrode is different from a signal applied to the first electrode region of the upper electrode.

3. The touch display apparatus according to claim 1, wherein the first electrode region of the upper electrode is selectively connected to a touch sensing part by the first link wire.

4. The touch display apparatus according to claim 1, wherein the encapsulating element includes a first encapsulating layer, a second encapsulating layer and a third encapsulating layer, which are sequentially stacked, the second encapsulating layer including a material different from the first encapsulating layer and the third encapsulating layer.

5. The touch display apparatus according to claim 4, wherein at least one encapsulating dam is disposed on the device substrate, and
   wherein the first encapsulating layer and the third encapsulating layer extend along a surface of the encapsulating dam, and the second encapsulating layer is disposed on a portion between the first encapsulating layer and the third encapsulating layer, the portion being laterally surrounded by the encapsulating dam.

6. The touch display apparatus according to claim 1, wherein the upper electrode extends in a first direction, and wherein the touch wire extends in a second direction which is different from the first direction.

7. The touch display apparatus according to claim 1, further comprising a separating partition on the bank insulating layer, the separating partition having a side of reverse taper,
   wherein the separating partition is disposed between the first electrode region and the second electrode region of the upper electrode.

8. The touch display apparatus according to claim 7, wherein the separating partition surrounds the emission area.

9. The touch display apparatus according to claim 7, wherein the first electrode region has a larger size than the emission area.

10. The touch display apparatus according to claim 1, wherein the second electrode region includes the same material as the first electrode region.

11. The touch display apparatus according to claim 1, wherein the second link wire is disposed between the device substrate and the bank insulating layer.

12. The touch display apparatus according to claim 11, wherein the second link wire includes the same material as the first link wire.

13. The touch display apparatus according to claim 11, wherein the second link wire extends parallel to the first link wire.

14. The touch display apparatus according to claim 13, wherein each of the first link wire and the second link wire includes a portion overlapping with the touch wire.

15. A touch display apparatus comprising:
a display panel, the display panel including:
   a device substrate;
   a pixel electrode on an emission area of the device substrate;
   a bank insulating layer covering an edge of the pixel electrode;
   a light-emitting layer on an exposed portion of the pixel electrode;
   a separating partition on the bank insulating layer;
   an upper electrode including:
      a first electrode region on the light-emitting layer; and
      a second electrode region separated from the first electrode region by the separating partition;
   an encapsulating element on the upper electrode; and
   a touch wire on the encapsulating element, the touch wire being spaced away from the emission area, the touch wire overlapping the separating partition;
a data driver coupled to the display panel; and
a touch driver coupled to the display panel.

16. The touch display apparatus of claim 15, wherein,
the first electrode region, in operation, receives power voltage; and
the second electrode region, in operation, receives a touch driving signal.

17. The touch display apparatus of claim 15, wherein,
the first electrode region, in operation, receives a power voltage during a display period, and is applied a touch driving signal during a touch period; and
the second electrode region, in operation, receives the touch driving signal during the touch period.

18. A touch display apparatus comprising:
a device substrate;
a pixel electrode on an emission area of the device substrate;
a bank insulating layer having an opening that partially exposes the pixel electrode;
a light-emitting layer on an exposed portion of the pixel electrode;
an upper electrode including:
   a first electrode region on the light-emitting layer; and
   a second electrode region spaced away from the first electrode region by a discontinuity in the upper electrode;
an encapsulating element on the upper electrode; and
a touch wire on the encapsulating element, the touch wire being spaced away from the emission area, the touch wire overlapping the discontinuity.

19. The touch display apparatus of claim 18, further comprising:
a separating partition on the bank insulating layer;
a first link wire between the separating partition and the emission area; and
a second link wire, the separating partition being between the second link wire and the first link wire.

20. The touch display apparatus of claim 19, wherein:
the first and second link wires extend in a first direction and are arranged in a second direction transverse the first direction; and
the touch wire extends in a third direction different than the first direction and different than the second direction.

* * * * *